United States Patent [19]
Chen et al.

[11] Patent Number: 5,665,629
[45] Date of Patent: Sep. 9, 1997

[54] FOUR TRANSISTOR SRAM PROCESS

[75] Inventors: Bomy Able Chen, Hopewell Junction, N.Y.; Gorden Seth Starkey, Essex Junction, Vt.

[73] Assignee: International Business Machines Corporation, Armonk, N.Y.

[21] Appl. No.: 514,016

[22] Filed: Aug. 11, 1995

[51] Int. Cl.⁶ .................................................. H01L 21/8244
[52] U.S. Cl. ...................... 438/384; 438/238; 438/608
[58] Field of Search .............................. 437/47, 60, 918, 437/189, 203, 26

[56] References Cited

U.S. PATENT DOCUMENTS

| | | | |
|---|---|---|---|
| 4,246,692 | 1/1981 | Rao | 29/571 |
| 4,416,049 | 11/1983 | McElroy | 29/571 |
| 4,690,728 | 9/1987 | Tsang et al. | 437/190 |
| 4,701,241 | 10/1987 | Schleisier | 156/643 |
| 4,702,937 | 10/1987 | Yamoto et al. | 437/233 |
| 4,727,045 | 2/1988 | Cheung et al. | 437/47 |
| 4,755,480 | 7/1988 | Yau et al. | 437/47 |
| 4,786,612 | 11/1988 | Yau et al. | 437/47 |
| 4,849,248 | 7/1989 | Hashimoto | 427/38 |
| 4,868,537 | 9/1989 | Blanchard | 338/308 |
| 4,950,620 | 8/1990 | Harrington, III | 437/60 |
| 4,956,313 | 9/1990 | Cote et al. | 437/203 |
| 5,030,588 | 7/1991 | Hosaka | 437/60 |
| 5,047,826 | 9/1991 | Keller et al. | 357/42 |
| 5,049,970 | 9/1991 | Tanaka et al. | 357/51 |
| 5,093,706 | 3/1992 | Mitsuhashi et al. | 357/41 |
| 5,135,882 | 8/1992 | Karniewicz | 437/52 |
| 5,140,299 | 8/1992 | Andrews, Jr. et al. | 338/308 |
| 5,159,430 | 10/1992 | Manning et al. | 357/51 |
| 5,232,865 | 8/1993 | Manning et al. | 437/60 |
| 5,330,930 | 7/1994 | Chi | 437/47 |

OTHER PUBLICATIONS

D. J. DiMaria, et al., "High Current Injection into $SiO_2$ from Si rich $SiO_2$ Films and Experimental Applications" J. Appl. Phys. 51 (5) pp. 2722–2734, May 1980.

M. Kinugawa, et al., "Cell Technology Directions for Advanced MPUs and Other Memory–Embedded Logic Devices" IEEE 1993, IEDM 93–97—93–40.

J. A. Parisi, "Metal Oxide Load for FET Memory Cell" IBM Technical Disclosure Bulletin, V. 14, #6, Nov. 1971, pp. 1745–1746.

Primary Examiner—Chandra Chaudhari
Assistant Examiner—Toniae M. Thomas
Attorney, Agent, or Firm—Kris V. Srikrishnan

[57] ABSTRACT

A SRAM cell with cross-coupled transistors, a pair of transfer gate transistors and a pair of load resistors is manufactured by forming a plurality of field effect transistors in a silicon substrate. In one embodiment, the transistors are formed in an SOI substrate to improve soft-error resistance. An insulator layer is deposited over the source, drain and gate contacts (device contact areas), hole openings are etched into the insulating layer to expose a plurality of device contact areas. A highly resistive layer is patterned to substantially cover and in contact with some selected contact hole openings and device contact areas. A conductive material is deposited into all of the contact hole openings so as to substantially over-fill the contact hole openings and make electrical contact with the device contacts and patterned resistive layer. A planarizing process used to remove the conductive material and the resistive layer outside of the contact holes, thus forming all contact studs with selected studs having integrated resistors. The contact studs are interconnected among themselves and connected to a power bus, a ground, word and bit lines to form the SRAM cell.

15 Claims, 6 Drawing Sheets

FOUR TRANSISTOR SRAM PROCESS

RELATED APPLICATION

This application is related to application Ser. No. 08/514,018 to B. Chen., entitled "Four Transistor SRAM Cell", assigned to the assignee of the present Application and filed coincident herewith and incorporated herein by reference.

FIELD OF INVENTION

The present invention relates generally to a semiconductor process for fabricating a four transistor Static Random Access Memory (SRAM) device and in particular to an improved process for defining a load resistor.

BACKGROUND OF THE INVENTION

Static random access memories are widely known in the semiconductor technology. A schematic of a generic SRAM cell is shown in FIG. 1. The cell is made of a cross coupled inverter, each inverter having a pulldown transistor T1 or T2 and a load p1 or p2, and a pair of transfer transistors T3,T4. The gate electrode of T1 is connected to the drain of T2 and the gate electrode of T2 is connected to the drain of T1 to provide the flip-flop operation. The load device p1,p2 may be a depletion or enhancement transistor or a high value resistor as the case for the present invention. The load devices p1 and p2 are connected to the power supply $V_{dd}$ on one side and to the drain of drive transistors T1, T2 respectively. The purpose of the resistor load p1,p2 and the power supply $V_{dd}$ is to counteract the effect of charge leakage at the drains of the drive and transfer transistors (nodes N1 and N2). The gates of the transfer transistors T3, T4 are connected to a WORD line 8 and are switched ON by asserting the WORD line 8. The drain/source contacts of the transfer transistors are connected between the nodes N1,N2 and BIT lines 5,6 respectively.

SRAM operation is well known. In brief, the charge (voltage) in nodes N1 and N2 represent the logic state of the cell. For example, to write a data of "1" in node N1, the bit line 5 is precharged to a desired voltage and the word line 8 is asserted. Node N1 is charged up and drives N2 to a "no charge" or a low state. To read the cell, bit lines 5 and 6 are precharged and word line 8 is asserted. The bit line 6 is discharged through transistor T4 and T2 and the transient is sensed by a sense amplifier external to the cell.

A four transistor (4T) SRAM uses a high value resistor as its load device. The attraction of 4T SRAM is the potential for reduced cell size compared to a 6T SRAM (load devices are transistors). The primary function of the load resistor is to supply enough current to compensate for the junction leakage and maintain the charge in the node. junction leakage current typically range from femtoampere to picoampere ($10^{-15}$ to $10^{-12}$ A) for FETs fabricated under contamination free conditions, which is the minimum current required from the loaded (p1,p2) power supply $V_{dd}$. The maximum resistor value acceptable is in the range of $10^2$ to $10^{15}$ ohms, assuming a $V_{dd}$ of 3 to 5 volts. The value of the resistor, in turn is affected by availability of material that has very high intrinsic resistance and the cell area available for resistor layout. In addition, the resistor material and process should be compatible with silicon manufacturing.

Intrinsic polysilicon, a suitable material for high value resistors, can be used in selected thickness range to provide sheet resistance as high as a few hundred giga ohms, but it takes up a large part of cell area. Since read operation causes temporary partial change in charge stored in the nodes N1 and N2, a higher current from the loaded power supply can restore the charge in the nodes quickly to its "write value". This restoration may determine how fast data can be repeatedly read. Also, soft-error susceptibility is increased when the charge in the node is off its maximum. Again, fast charging from the power supply can reduce soft error occurrence as the nodes will be charged to full voltage and is less susceptible than if the charge levels were lower. A soft error is caused when the electron-hole current generated in the silicon from ionizing radiation upsets the charge in the node and causes the cell to flip. These considerations suggest use of a lower value leakage resistor. These problems are known and are reviewed in an article titled, "Cell Technology Directions For Advanced MPUs and Other Memory Embedded Logic Devices", by Kinugawa and Katama in 1993 IEEE IEDM, pp 37–40. However, the primary attraction of a 4T-SRAM continues to be its small size and lower manufacturing cost for stand alone memory. It has been the goal of many researchers to develop resistors of higher value so that a high value resistor can be easily integrated into the SRAM process using minimum chip area. Hashimoto (U.S. Pat. No. 4,849,248) teaches ion implanting silicon into $SiO_2$ and annealing to obtain segregates (islands) of silicon in an $SiO_2$ film, thus forming high value resistors. Blanchard (U.S. Pat. No. 4,868,537) teaches implanting ions of Cesium into the $SiO_2$ layer to form resistors. Tanaka et al., (U.S. Pat. No. 5,049,970) teaches ion injecting silicon ions and conductive impurities in the oxide film to form a resistor. Sandhu et al., (U.S. Pat. No. 5,235,312) teaches a method of oxidizing a thin layer of polysilicon so as to oxidize all individual grains to form a high resistance layer. Yamoto et al., (U.S. Pat. No. 4,702,937) describes two layers of polysilicon with an interspersed oxide layer, thus forming a high value resistor suitable for SRAM applications.

Harrington III (U.S. Pat. No. 4,950,620) teaches a process for making a compact four transistor SRAM using arsenic implantation in selected areas of the dielectric overlying the substrate. In Harrington's process, the dielectric mask for implantation and the contact opening are not self-aligned leading to a larger cell size. Yau et al. (U.S. Pat. No. 4,786,612) teaches a method of forming Si rich silicon nitride semi-insulating film by PECVD deposition, between two conducting layers. In one of the embodiments, Yau forms the semi-insulating layer over a tungsten silicide layer. Yau's method forms a vertical resistor, but suffers from the fact that the vertical resistor is located away from the diffusion contact regions, thereby increasing the SRAM cell size. Further, the PECVD deposited resistive layer is patterned using a separate mask than the contacting layer and the process is not self-aligned.

Manning (U.S. Pat. Nos. 5,159,430 and 5,232,865) teaches forming polysilicon filled vias in contact with Si device and subsequently implanting oxygen or nitrogen to increase the resistance of the polysilicon stud as shown in FIG. 2. A high temperature anneal at about 950 C is carried out to stabilize the resistor value. Since load resistors are required only in some of the contacts, Manning's process will involve fabricating the resistor contacts in a separate step. i.e it will take two mask steps to fabricate all the contacts. An annealing temperature of 950 C is high for very shallow doped devices, which can cause dopant spreading and affect Junction widths. It is therefore preferable to form a high resistor using a lower temperature process. These prior art methods teach forming a high value resistor by either introducing silicon in an $SiO_2$ layer or introducing oxygen or nitrogen into a Si layer, i.e by forming off-stoichiometric structures. A detailed discussion of enhanced conduction of insulators can be found in an article entitled "High current injection into SiO2 from Si rich $SiO_2$ films and experimental applications", by D. J. DiMaria and D. W. Dong, Journal of Applied Physics 51(5) May 1980, pp 2722-2735.

Another prior art method by Mitsuhashi et al., (U.S. Pat. No. 5,093,706) involves fabricating discrete resistor layer, comprising a stacked thermal oxide and nitride layers, over the diffusion region, coating with an insulating layer and forming a contact opening in the insulating layer to the resistor as shown in FIG. 3. Referring to FIG. 3, a highly resistive leaky layer 15a, 15b is formed directly over the diffusion region of an FET transistor and cladded with polysilicon 18. An insulator layer 20 is deposited on the substrate, and an opening 22 is etched in insulator 20 to make contact to the polysilicon overlying the resistor. The resistive, layers 15a, 15b functions as a vertical resistor, but the contact area from opening 22 has to be designed smaller in order to fully land the contact electrode 24. Further, masking processes used for etching contact opening 22 and for etching resistor stack 15a, 15b, are printed to minimum lithographic ground rules (critical masks), which increases the process complexity. Critical masks are difficult to align and process than non-critical masks. Mitsuhashi's process has a further disadvantage of requiring two separate masks with overlay tolerance which increases the cell size.

SRAMs are susceptible to soft errors. A soft error occurs, when an ionizing radiation strikes the Si substrate and creates free electrons and holes. The free electrons and holes migrate under electric fields to different parts of devices, and can change the state of a memory cell or interfere with reading data from cells. Load resistor SRAMs may be more susceptible than 6T-SRAMs if the current supply to restore soft error ionization is too small, i.e on the order of pico-ampere per cell. However, use of high load current can lead to excessive power consumption. There is therefore a need to have an improved high resistance SRAM that requires a steady low current, is compatible with low power supplies, takes up very little space, has improved soft error tolerance and has low process complexity.

OBJECTS OF THE INVENTION

An object of the present invention is to improve SRAM yield and reliability.

A further object of the present invention is to reduce SRAM manufacturing cost, provide a process suitable for large substrates and a small cell size.

A still further object of the present invention is to improve SRAM soft error tolerance.

Another object of the present invention is to provide a process that provides a self-aligned vertical resistor and greater resistor uniformity.

SUMMARY OF THE INVENTION

An SRAM cell with cross-coupled transistors, a pair of transfer gate transistors and a pair of load resistors is manufactured by forming a plurality of field effect transistors in a silicon substrate. In one embodiment, the transistors are formed in an SOI substrate to improve soft-error resistance. An insulator layer is deposited over the source, drain and gate contacts (device contact areas), hole openings are etched into the insulating layer to expose device contact areas. A highly resistive layer is patterned to substantially cover and in contact with some selected contact hole openings and device contact areas. A conductive material is deposited into all of the contact hole openings so as to substantially over-fill the contact hole openings and make electrical contact with the device contacts and patterned resistive layer. A planarizing process used to remove the conductive material and the resistive layer outside of the contact holes, thus forming all contact studs with selected studs having integrated resistors. The contact studs are interconnected among themselves and connected to a power bus, a ground, word and bit lines to form the SRAM cell.

BRIEF DESCRIPTION OF THE DRAWINGS

The objects, features and advantages of the present invention will be apparent from the following more particular description of the invention illustrated in the accompanying drawings, in which.

DETAILED DESCRIPTION OF THE INVENTION

Figure 1:
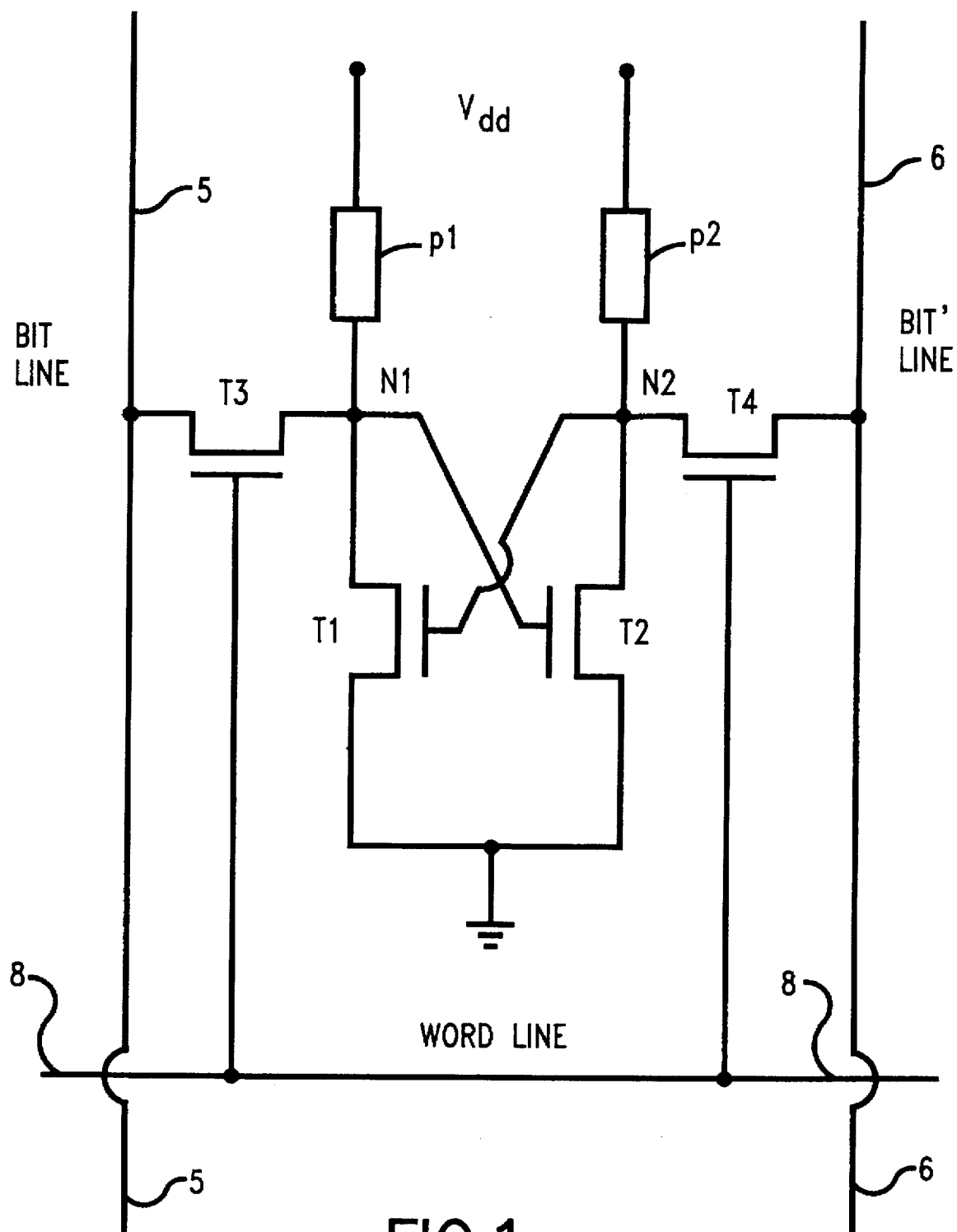
FIG. 1 is a prior art SRAM circuit
Figure 2:
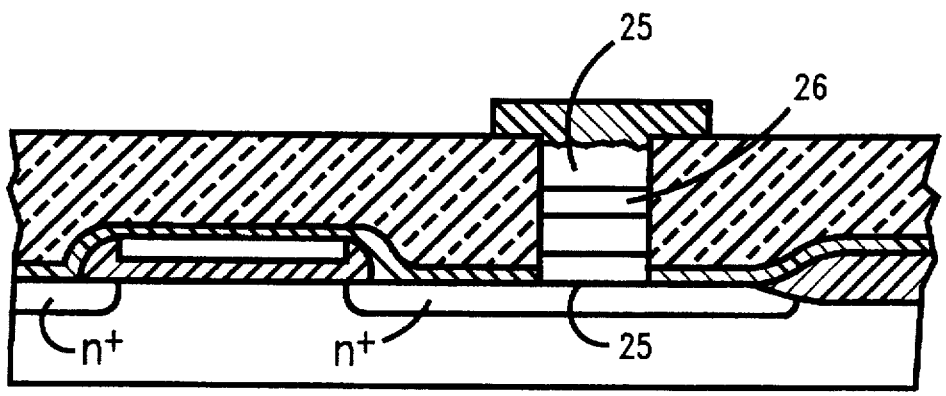
FIG. 2 is a prior art SRAM cell structure with an implant resistor in a via.
Figure 3:
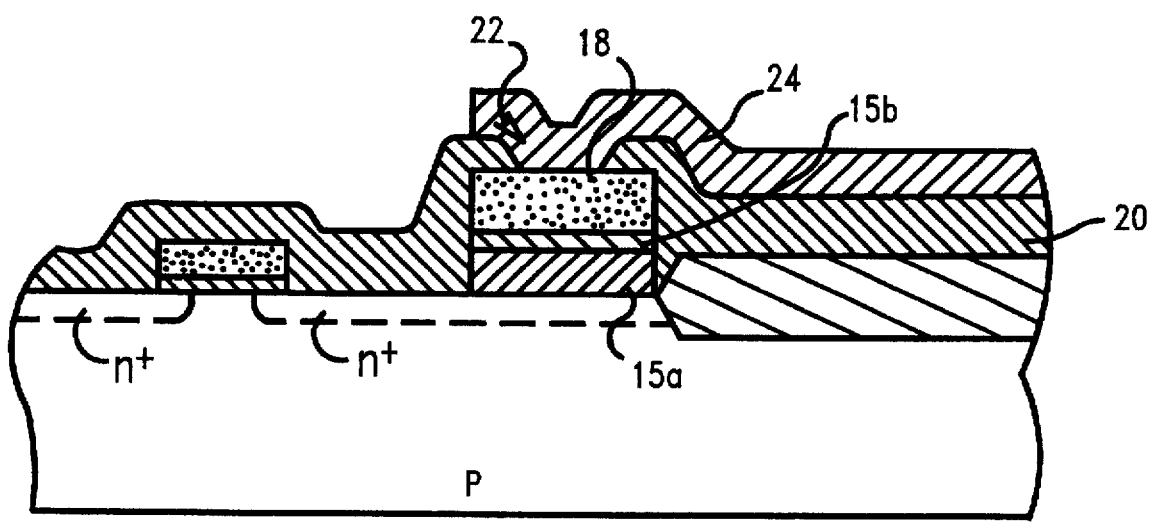
FIG. 3 is a prior art SRAM structure using a vertical resistor in a via.

The present invention is to form an improved vertical resistor in contact with a shared diffusion area of the device and connect it to a power bus (power supply) $V_{dd}$ as shown in FIG. 1. The present invention is readily integrated in processes that use vertical stud connections in place of tapered via connections. The vertical stud connection is more process intensive, but reduces the process bias of contacts or vertical wiring, allowing for closer placement of devices and thereby achieving high wiring density. For high performance FET devices, the contacts are increasingly formed using CVD W or highly doped polysilicon and in some cases Al alloys with a suitable diffusion barrier such as TiN. Etch back is the preferred process for planarizing the insulator and metal in the case of W. Another emerging process used to planarize the insulator or metal in order to form vertical connecting studs is chemical mechanical polishing. According to the preferred embodiments of the present invention, chemical mechanical polishing or etch-back techniques are used to define the load resistor as an integral part of a contact stud in a self-aligned manner. In the preferred process a resistor element is formed using a non-critical block-out mask to fully cover the contact stud opening. This is followed by a contact wiring stud process in which the wiring stud material outside of the hole opening is removed. For those studs with an integral resistor, the resistor layer outside of the hole opening is removed at the same time as the wiring stud material. Thus, the final dimension and position of the resistor is defined by the vertical contact opening in the insulator and by the etch back process. Since vertical holes are etched to controlled dimensions, the inventive process leads to precise control of the resistor area. Since the thickness can be well controlled by the deposition process, the geometrical dimensions of the resistors can be precisely controlled by the inventive process. Further, the resistors take no more space than the vertical studs, and therefore the cell area is defined by area required for forming the transfer and drive transistors. Since only a coarse level mask is involved in the initial definition of the resistor, the process is simpler than prior art processes. Further, by combining such a process with a buried oxide layer in the substrate, SRAM cells have improved resistance to soft-error. These and other innovative steps can be better understood by the following illustrations of the preferred embodiments.

Figure 4A:
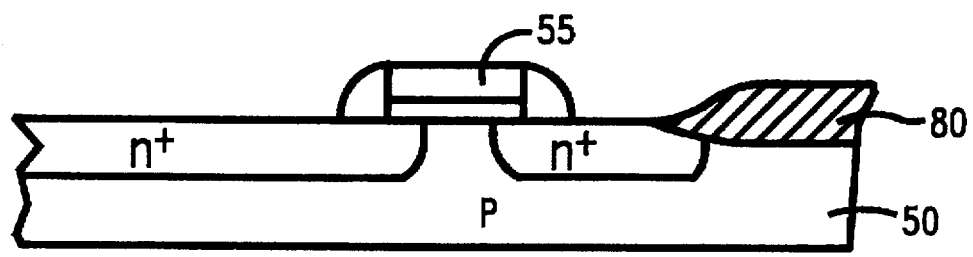
FIGS. 4A–4E shows key process steps of an embodiment of the present invention.
Figure 4B:
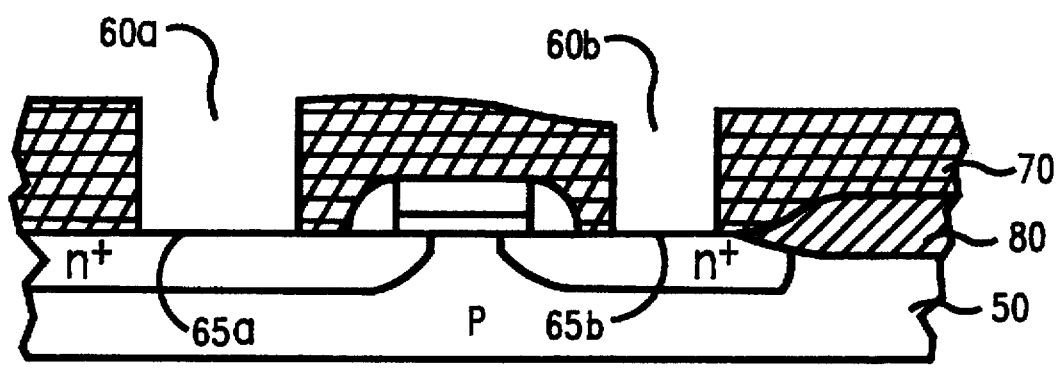

Referring to FIG. 4A, a cross section of a conventional FET device is shown. A substrate 50 of first conductivity has therein formed a gate electrode 55, a recessed oxide region 80 (ROX) and diffusion regions of second conductivity (source and drain of the FET device). The first and second conductivity refers to conduction by n type or p type impurities respectively or vice versa. Referring now to FIG. 4B, an insulator 70 is deposited over the FET device regions and the ROX 80. Insulating layer 70 is shown to be somewhat planar. The planarization of layer 70 is optional. A plurality of near vertical openings 60a and 60b are etched into insulating layer 70 using conventional processes (not described) into the insulator 70 and form a contact surface 65a and 65b with drain and source region of the FET device. The term "contact area" is broadly used in this application to include an exposed surface of an electrically conducting region, that is either connected to or an extension of the device region. If the insulating layer is either plasma enhanced chemical vapor deposited or low temperature chemical vapor deposited silicon dioxide or nitride, vertical openings can be etched using reactive ion etching processes with gases such as CF4 or SF6. The silicon dioxide can be doped with boron or phosphorus and reflowed to smooth the contour of the insulator. The contact surfaces 65a and 65b shown can be either doped single crystal silicon or silicided Si. Silicidation is well known in semiconductor technology and process steps required for forming silicide will not be discussed in here. Other contact openings may exist but are not shown in the illustrations for convenience.

The load resistor p1 and p2 can be formed over a selected diffusion region or a polysilicon electrode. Among all possible contacts 65a, 65b for each cell, two load resistors will be formed on two of the contacts in this example. For illustrative purposes, contact opening 60a and contact surface 65a are the ones chosen to receive the load resistor. The contact surface 65a can be simply a doped Si or it can be a silicided region. In some applications contact area 65a can be part of a thin local interconnect such as poly Si or metallic silicide.

Figure 4C:
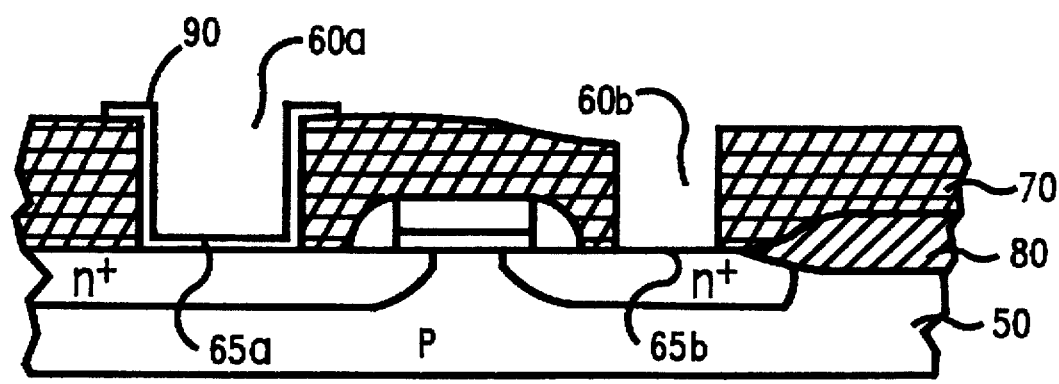

Referring now to FIG. 4C, a highly resistive layer 90 is formed over the contact opening 60a, using preferably a chemical vapor deposition or a physical deposition process. The thickness and the composition of the layer 90 is predetermined by independent experiments. The resistivity values, reported in DiMaria and Dong reference cited earlier, range from $10^6$ to $10^{10}$ ohm per centimeter for off-stoichiometric $SiO_2$ with Si in the range of 0.4 to 0.46 (as against stoichiometric 0.33) atomic percent. For a 0.5 µm contact, 30 nm of a Si rich film with a resistivity of $10^6$ ohm-cm is selected to obtain a resistor of about $10^9$ ohms. The silicon content in a CVD or a PECVD film can be controlled by decreasing the ratio of $N_2O$ to $SiH_4$ in the case of silicon dioxide or $NH_3$ to $SiH_4$ in the case of silicon nitride. The higher the silane, the more the amount of silicon in the resulting film. Process variables can be characterized for a specific tool, to yield a specific silicon content and a specific resistivity. Sputtering targets of specific composition can also be readily obtained and used as a source to sputter a thin film. The high resistivity of Si rich silicon dioxide film, according to DiMaria and Dong, is due to formation of islands of silicon interspersed with silicon dioxide region. Similarly Ta rich $Ta_2O_5$, Ti rich $TiO_2$, Al rich $Al_2O_3$, Si rich SiN and other such films are also known to have very high resistance and can be formed using similar techniques as used for forming Si rich silicon dioxide. These films are also good candidates for use as layers for load resistors. In the case of Ta, Al etc, a pure film can be deposited and electrochemically oxidized (anodized) to produce a film of desirable resistivity values. The films are deposited using processes with temperatures lower than 750° C. Sputtering and PECVD processes operate at temperatures in the range of 200°–500° C.

Figure 4D:
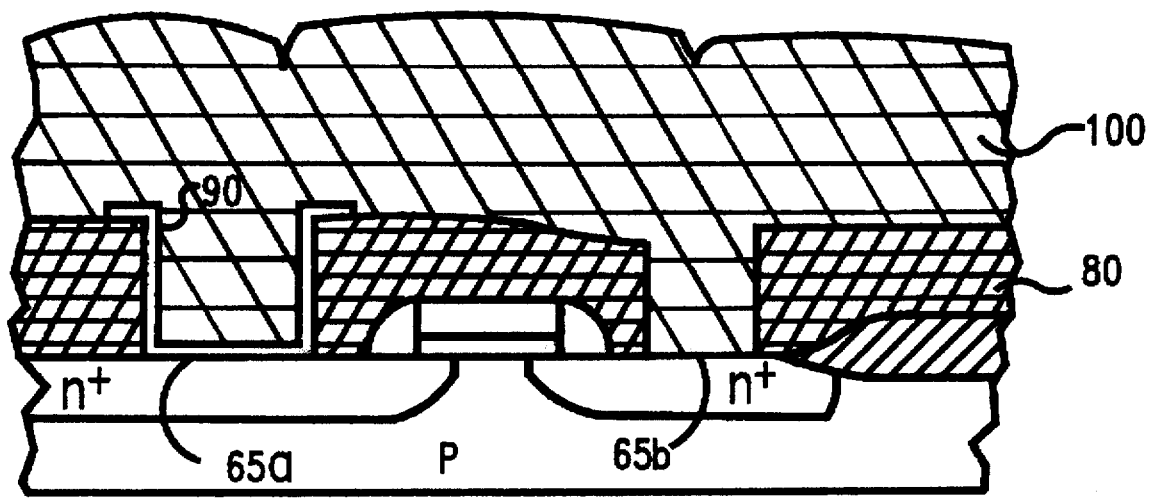
Figure 4E:
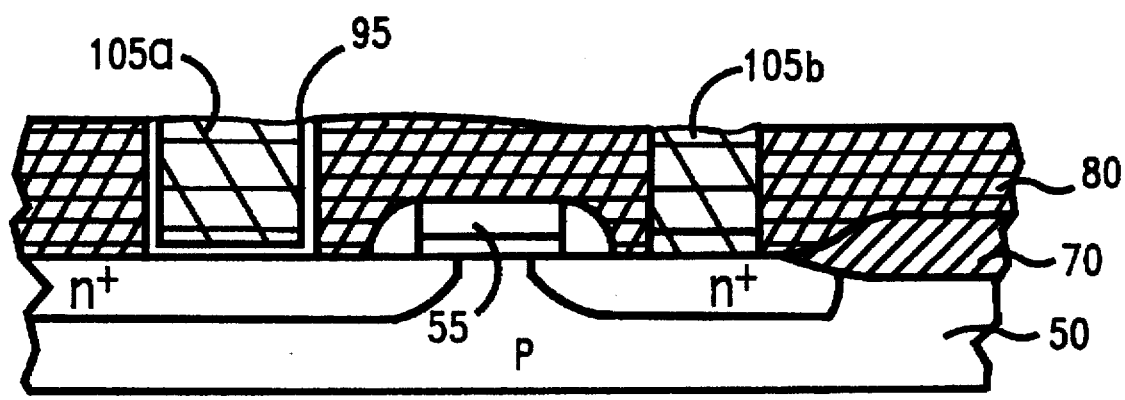

Next referring to FIG. 4C, the resistor layer 90 is patterned to cover the contact opening 65a. As shown in FIG. 4c, layer 90 completely overlaps the contact hole, which is defined by a non-critical blockout mask, as only two contacts per SRAM cell will receive layer 90. If a blanket resistive layer is formed, then using a blockout mask of dimension larger than the contact area 65a is used to pattern the resistor material. Since the Si rich oxide film is only slightly non-stoichiometric, it can be etched using a suitable dilute or buffered hydrofluoric (HF) solution. Fluorine based dry etching is also feasible. Alternatively if a directional physical deposition process is used such as sputtering with a collimator, evaporation, laser ablation etc., a lift-off or soluble resist stencil or a removable hard mask can be used to selectively add the resistor material. Lift-off process involves forming a soluble stencil with etched holes, depositing a layer of resistor material by using a directional deposition process, removing said soluble stencil along with portions of said resistive layer except for portions of resistive layer in said soluble stencil openings. Now referring to FIG. 4D, all the contacts 65a, 65b are filled with a contact stud metal 100. In this example, the material 100 is CVD W. The metallic liner such as TiN or TiW used for CVD W deposition and their method of deposition (CVD or sputtering) are not discussed here, but it is understood that layer 100 refers to the composite structure of liners and CVD W. Aluminum, Al—Cu, Al—Ti and other Al alloys and layered structures made of aluminum or copper as a primary layer, copper, copper alloyed with small impurities, Cu—Al, Cu—Sn, molybdenum or other metallization can be used as the conducting material for the contact stud. FIG. 4E shows the resulting structure after the layer 100 and excess resistor material from layer 90 outside of the contact opening is removed so as to form region 95, by a chemical mechanical polish such as taught in U.S. Pat. No. 4,956,313 issued to Cote et al, and assigned to the assignee of the present application. The excess W outside the contact hole is removed by polishing. Since W polish process also removes $SiO_2$, by selecting a predetermined overpolishing time, the excess of the resistor layer 90 can be removed to make it "flush" with the contact opening.

Figure 5:
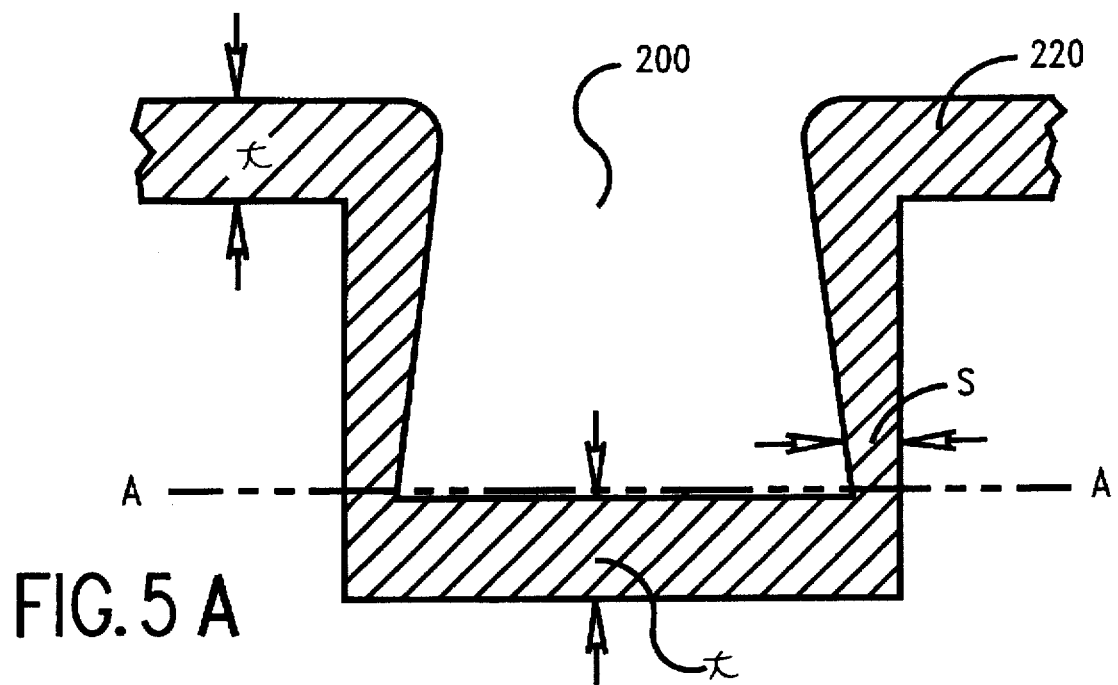
FIGS. 5A–5B shows a typical cross sectional profile of resistive layer from sputtering and CVD deposition process.
Figure 5:
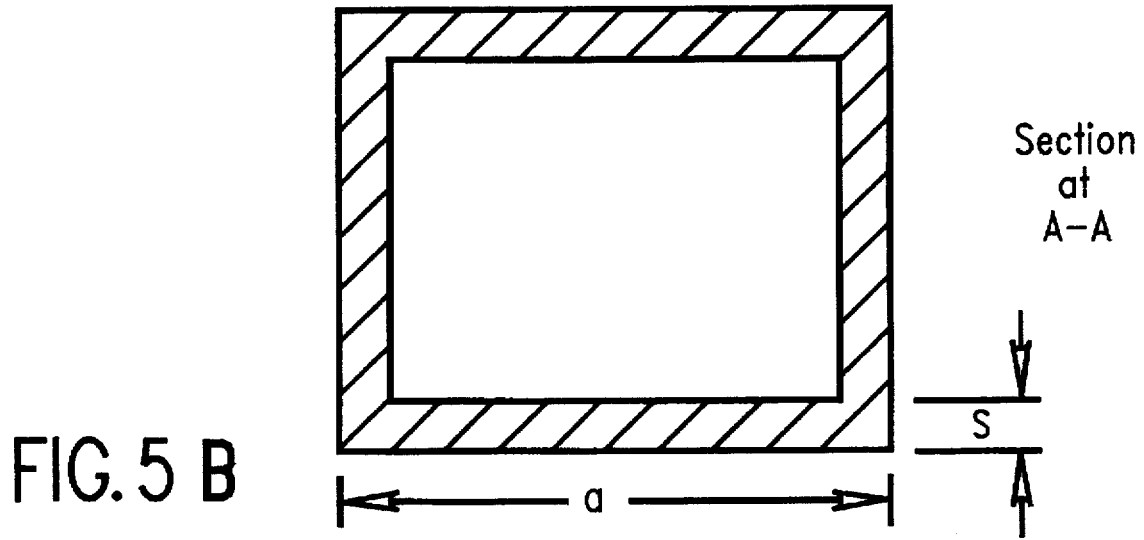

Alternatively, when the chosen stud material is easily etched using a plasma or other technique such as ion milling, any one of these etch back processes can be used to achieve a planar stud structure. For example, in the case of W, a fluorine containing plasma can be used for etch back with or without a planarizing organic layer. Referring to FIG. 4E, the contact stud 105a has a built-in resistor 95 in series whereas 105b has no resistor. At this point conventional processing is continued to complete the wiring of the cell and rest of the circuits. Since the removal process promotes co-planarity of the contact stud 105a and 105b with the surrounding insulating layer 80, their top surfaces are roughly planar. The resistor contact area is defined in a self aligned manner by the contact hole area and by the geometry of the resistor layer coverage in the hole. This is illustrated in FIGS. 5A and 5B. If the contact hole opening is a square with a width of "a" and if the nominal thickness of the resistor material is "t", then depending on the process, the thickness of the resistor near the bottom end of the contact hole will be "s", where s/t characterizes the conformality of deposition. Conformality values are usually quoted from 0 to 1, where a value of 1 correspond to perfect or 100% step coverage. Referring to FIGS. 5A and 5B example, "a" is typically 0.5 micron, "t" is chosen to be 50 nm and "s/t" is typically 0.5. The cross sectional area of the vertical transistor in contact with the low resistance contact material is about 90% of the contact opening for this example. The tolerance in the value of the vertical resistor is primarily determined by the process tolerance in printing and etching contact openings, the thickness tolerance of the deposition process and the resistivity variation from resistor deposition process (stoichiometry, for example). If each of these variables are controlled to less than 10% (3 sigma), then the resistor variation by using root mean square (RMS) of individual variations is about 17%, which is sufficient for SRAM applications.

Figure 6A:
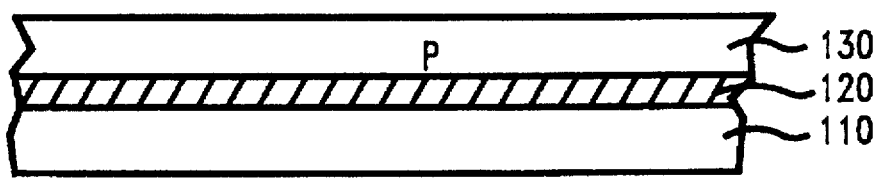
FIGS. 6A–6D shows key steps of an alternate embodiment of the present invention.
Figure 6B:
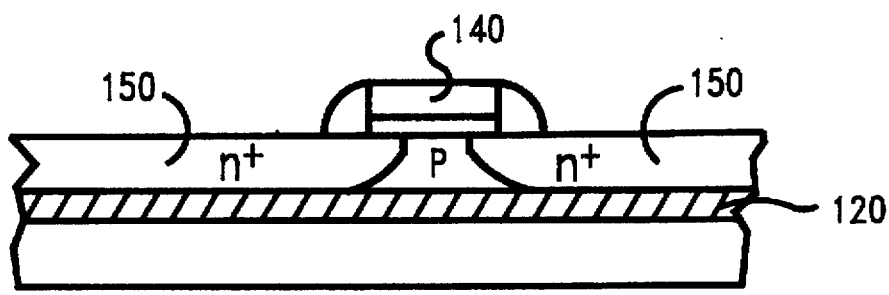
Figure 6C:
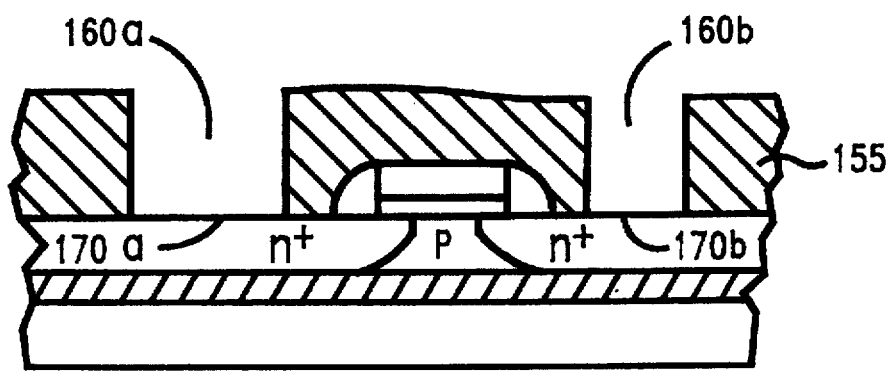
Figure 6D:
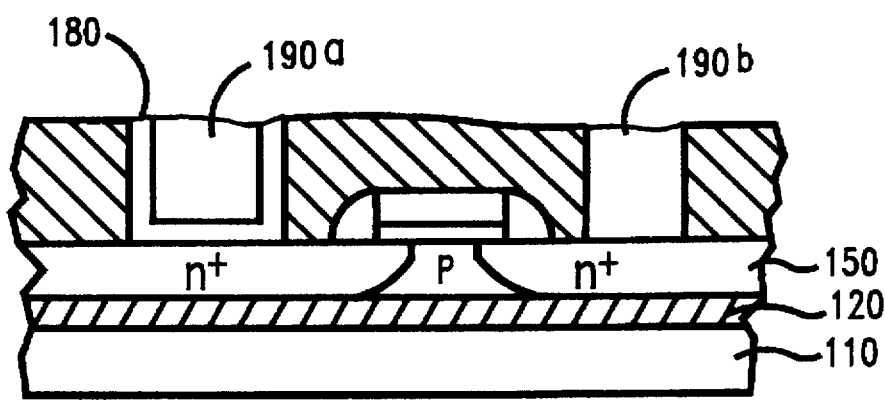

The resistance to soft-error of the SRAM cell can be significantly improved by building the devices on a buried oxide layer 120 as shown in FIG. 6A so as to electrically isolate the transistors from the substrate. This eliminates the problems of free electrons and holes created in the substrate migrating to the device. Referring to FIG. 6A, the starting substrate, 110 has an oxide layer 120 and a thin single crystalline layer 130 (epitaxy layer) of first conductivity. These substrates are usually known as silicon-on-insulator (SOI) wafers and are made using well known techniques, such as oxygen implant and anneal or wafer bonding and thinning. The SOI fabrication techniques will not be discussed here. Referring to FIG. 6B, a gate stack 140 is defined over the epitaxy layer 130 by known processes and regions of second conductivity 150 abutting the gate regions are formed by doping the silicon with selected impurities. These devices separated from the bulk substrate 110 by the oxide layer 120 have greater soft-error immunity. Referring now to FIG. 6C, a blanket insulator 155 is deposited on the surface of substrate 110 and a plurality of contact holes 160a,160b are etched into the insulator 155 to provide the contacting surface 170a and 170b respectively. Following the process steps outlined earlier in FIGS. 4A–4E, the device structure shown in FIG. 6D is built, wherein vertical resistor 180 is integrated into contact stud 190a. During subsequent processing, the contact studs are interconnected and connected to a power bus, bit lines and word lines to complete the SRAM cell.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A method of forming a contact stud with an integral vertical resistor using a self aligned process, said method comprising the steps of:

providing a plurality of devices and a plurality of contact areas on a substrate, each said device having at least one contact area;

depositing an insulating layer over said substrate, said deposited insulating layer overlying and in contact with said plurality of contact areas;

etching contact hole openings in said insulating layer to expose said plurality of contact areas;

patterning a layer of resistive material to substantially cover and in contact with selected contact hole openings;

depositing a conductive material into all of said contact hole openings so as to substantially over-fill said contact hole openings and be in electrical contact with said plurality of contact areas and said patterned layer of resistive material; and, removing said conductive material and said patterned layer of resistive material from said substrate outside of said contact hole openings.

2. The method of claim 1, wherein said step of patterning a layer of resistive material comprises the steps of:

depositing said layer of resistive material over the insulating layer and all of said contact hole openings, said deposited layer being in contact with said contact hole openings;

forming a blockout mask to protect said layer of resistive material over selected contact hole openings; and etching said layer of resistive material exposed by said blockout mask.

3. The method of claim 1, wherein said step of patterning a layer of resistive material comprises the steps of:

forming a soluble stencil with openings correspond to selected contact hole openings;

depositing said layer of resistive material using a directional physical deposition process; and, removing said soluble stencil along with portions of said layer of resistive material outside of the openings of said soluble stencil.

4. The method of claim 1, wherein said layer of resistive material is selected from a group consisting of Si rich silicon dioxide, Si rich silicon nitride, Ta rich Tantalum oxide and Ti rich titanium oxide.

5. The method of claim 1, wherein said step of removing said conductive material and layer of resistive material from said substrate outside of said contact hole openings, uses a chemical mechanical polish process.

6. The method of claim 1, wherein said step of removing said conductive material and layer of resistive material from said substrate outside of said contact hole openings, uses an etch back process.

7. The method of claim 1, wherein said conductive material is selected from a group consisting of tungsten, molybdenum, aluminum, Al—Cu, Al—Ti, copper, Cu—Sn, Cu—Al, layered structure with aluminum and layered structure with copper.

8. A method of manufacturing an SRAM cell comprising of cross-coupled transistors, a pair of transfer gate transistors and a pair of load resistors, comprising the steps of:

providing a plurality of field effect transistors and a plurality of contact areas on a substrate, each said field effect transistor having at least one contact area;

depositing an insulating layer over said substrate in contact with said plurality of contact areas;

etching contact hole openings in said insulating layer to expose said plurality of contact areas;

patterning a layer of resistive material to substantially cover and in contact with selected contact hole openings;

depositing a conductive material into all of said contact hole openings so as to substantially over-fill said contact hole openings and in electrical contact with said plurality of contact areas and said patterned layer of resistive material;

removing said conductive material and said resistive material from said substrate outside of said contact hole openings thereby forming a plurality of contact studs and, connecting said contact studs to a power bus, a ground, word and bit lines and to each other thereby forming said SRAM cell.

9. The method of claim 7, wherein said step of patterning a layer of resistive material comprising the steps of:

depositing said layer of resistive material over the insulating layer and all of said hole openings, said deposited layer being in contact with said hole openings;

forming a blockout mask to protect said layer of resistive material over selected contact hole openings; and etching said layer of resistive material exposed by said blockout mask.

10. The method of claim 8, wherein said step of patterning a resistive layer comprises the steps of:

forming a soluble stencil with openings correspond to said selected hole openings;

depositing said resistive layer using a directional physical deposition process; and, removing said soluble stencil along with portions of said resistive layer outside the openings of said soluble stencil.

11. The method of claim 8, wherein said layer of resistive material is selected from a group consisting of Si rich silicon dioxide, Si rich silicon nitride, Ta rich Tantalum oxide and Ti rich titanium oxide.

12. The method of claim 8, wherein said step of removing said conductive material and layer of resistive material from said substrate outside of said contact hole openings, uses a chemical mechanical polish process.

13. The method of claim 8, wherein said step of removing said conductive material and layer of resistive material from said substrate outside of said contact hole openings, uses an etch back process.

14. The method of claim 8, wherein said conductive material is selected from a group consisting of tungsten, molybdenum, aluminum, Al—Cu, Al—Ti, copper, Cu—Sn, Cu—Al, layered structure with aluminum and layered structure with copper.

15. The method of claim 8, wherein said substrate containing a plurality of field effect transistor is a silicon-on-insulator.

* * * * *